Jan. 24, 1967 W. G. KLEHM, JR 3,300,725
REVERSIBLE ELECTRONIC COUNTER
Filed April 5, 1963
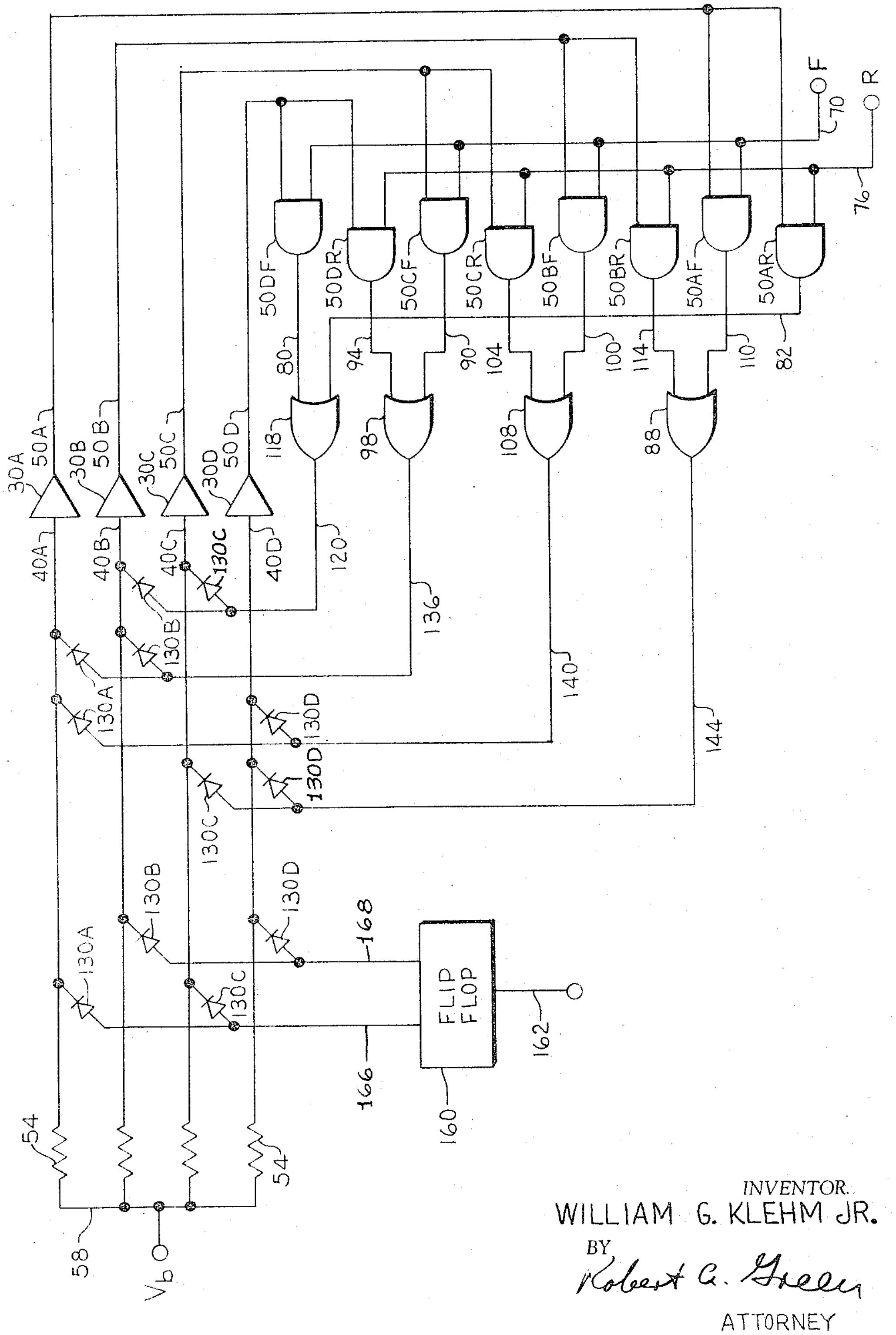
INVENTOR.
WILLIAM G. KLEHM JR.
BY
Robert C. Green
ATTORNEY

United States Patent Office

3,300,725
Patented Jan. 24, 1967

3,300,725
REVERSIBLE ELECTRONIC COUNTER

William G. Klehm, Jr., Farmington, Mich., assignor to Burroughs Corporation, Detroit, Mich., a corporation of Michigan Filed Apr. 5, 1963, Ser. No. 270,885
2 Claims. (Cl. 328—44)

This invention relates to electronic counter circuits and particularly to semiconductor counter circuits which are reversible in operation.

One type of electronic semiconductor counter recently devised utilizes a diode matrix to feed counting signals to, and to interconnect, a plurality of transistors, or the like, one transistor being provided for each counting step to provide digital or decimal output logic. Such a circuit can be coupled directly to a decimal readout or indicator device to provide a visual indication of the counting operation. Counters of this type are known as diode matrix counters. Circuits for operating diode matrix counters as reversible counters have been suggested, and these circuits are quite satisfactory. However, the present invention provides a reversible diode matrix counter which is different in construction and in its mode of operation and fills a gap in the diode matrix counter prior art.

The objects of the present invention concern the provision of a novel semiconductor counter utilizing a diode matrix and operable to count in both forward and reverse directions.

Briefly, a counter circuit embodying the invention includes a plurality of counting devices, each of which comprises a separate step in a counting series having a forward direction and a reverse direction. Each counting device has input and output connections, and the output of each device is coupled through two circuit paths and through a diode matrix to the input of every other device except the adjacent leading and lagging devices on each side of it in the series. A source of counting pulses is also coupled through the diode matrix to each counting device. Circuit means are coupled to each of the two circuit paths for operating only one of said two circuit paths at a time, whereby the counter can be made to count either in the forward or reverse directions.

The drawing is a schematic representation of a reversible counter circuit embodying the invention.

Referring to the drawing, a counter circuit 20 embodying the invention includes a plurality of count registering devices 30 which may be electron discharge devices or semiconductor devices such as transistors or the like. In the following description of the invention, it is assumed that the devices 30 are transistors. Each transistor 30 operates in the nature of a switch and is adapted to execute or register one count, and the total number of transistors provided in the series of counters is determined by the total number of counts to be executed by the counting circuit. For convenience, only four counting steps are shown including transistors 30A, 30B, 30C and 30D. When the counting operation proceeds from transistor 30A to 30B to 30C to 30D, it is in the forward direction, and, when it is from 30D to 30C to 30B to 30A, it is in the reverse direction. In the circuit, it is assumed that the transistors 30 are PNP transistors; however, it is clear that NPN transistors or the like devices may be used to perform the same function. Each transistor includes base, emitter, and collector electrodes which are not shown in detail. Each transistor includes an input lead 40A, 40B, 40C, 40D to its base electrode and an output lead 50A, 50B, 50C, 50D from its collector electrode, and the emitter electrode is grounded.

Each input lead 40 is coupled through a resistor 54 to a bus 58 which is connected to a negative D.C. power supply V*b*. The output lead 50 of each transistor is coupled to the input of two separate AND gates, with lead 50A coupled to gate 50AR and gate 50AF, lead 50B coupled to gate 50BR and 50BF, lead 50C coupled to gate 50CR and 50CF, and lead 50D coupled to gate 50DR and 50DF. Thus, two groups of AND gates are provided in the circuit, one group including gates 50AR, 50BR, 50CR, 50DR, and the other group including 50AF, 50BF, 50CF, and 50DF. A forward count control line 70 is coupled to each AND gate in the one group, and a reverse count control line 76 is coupled to each AND gate of the other group.

The output 80 of the first AND gate 50DF of the second group and the output 82 of the last AND gate 50AR of the first group are coupled to the input of an OR gate 118. The output 90 of the second AND gate 50CF of the second group and the output 94 of the first AND gate 50DR of the first group are coupled to the input of an OR gate 98. The output 100 of the third AND gate 50BF of the second group and the output 104 of the second AND gate 50CR of the first group are coupled to the input of an OR gate 108, and the output 110 of the fourth AND gate 50AF of the second group and the output 114 of the third AND gate 50BR of the first group are coupled to the input of the OR gate 88.

The OR gate 118 includes an output lead 120 which is coupled through diodes 130B and 130C, oriented as shown, to the input leads 40B and 40C of transistors 30B and 30C. The OR gate 98 includes an output lead 136 which is coupled through diodes 130A and 130B, oriented as shown, to the input leads 40A and 40B of transistors 30A and 30B. The OR gate 108 has an output lead 140 which is coupled through diodes 130A and 130D, oriented as shown, to the input leads 40A and 40D of transistors 30A and 30D, and the OR gate 88 has an output lead 144 which is coupled through diodes 130C and 130D to the input leads 40C and 40D of transistors 30C and 30D.

If desired, auxiliary amplifiers (not shown) may be coupled between the OR gates and the input leads to the various transistors 30A to 30D.

It can be seen that transistor 30D is coupled through AND gate 50DR and OR gate 98 as a first path in the reverse direction, and through AND gate 50DF and OR gate 118 as a second path in the forward direction. Similarly, transistor 30C is coupled through AND gate 50CR and OR gate 108 as a first path in the reverse direction, and AND gate 50CF and OR gate 98 as a second path in the forward direction. Transistor 30B is coupled through AND gate 50BR and OR gate 88 as a first path in the reverse direction, and through AND gate 50BF and OR gate 108 as a second path in the forward direction. Transistor 30A is coupled through AND gate 50AR and OR gate 118 as a first path in the reverse direction, and through AND gate 50AF and OR gate 88 as a second path in the forward direction.

A source of counting pulses comprising a flip-flop 160 is provided to apply counting pulses to the transistors 30. The flip-flop includes a single input 162 which is coupled to a suitable source of counting pulses (not shown). The flip-flop also includes two output leads 166 and 168, one of which 166 is coupled through diodes 130A and 130C, oriented as shown, to the input leads 40A and 40C of transistors 30A and 30C, the other of which 168 is coupled through diodes 130B and 130D, oriented as shown, to the input leads 40B and 40D of transistors 30B and 30D.

In operation of the circuit 20, assuming that it is desired to count in the forward direction, then the group of forward AND gates 50AF to 50DF are rendered active by the application of a suitable voltage level to the forward count control line 76. Each of these AND gates can now be operated by the application thereto of a pulse from one of the transistors 30. The counting cycle is initiated by turning on transistor 30A in any suitable fashion, for example, by the application of a negative pulse to its input lead 40A. When transistor 30A is turned on, its collector or output electrode assumes the potential of the emitter electrode which is about ground potential, and this potential is coupled through output lead 50A to the AND gate 50AF and the OR gate 88 to the lead 144 which is coupled through diodes 130C and 130D to transistors 30C and 30D. The application of ground potential to the input electrodes of these transistors holds them off. It is assumed that the flip-flop 160 is in the state in which output lead 166 is at a generally negative potential and output lead 168 is at ground potential. Thus, the ground potential of lead 168 is coupled through diode 130B to the input electrode of transistor 30B which is also held off.

The first counting pulse applied to the flip-flop reverses the potentials of its output leads 166 and 168, and, with the ground potential removed from the input of transistor 30B, a generally negative potential from source V*b* is applied thereto, and transistor 30B is turned on. When transistor 30B is turned on, its output electrode and its output lead 50B assume ground potential, and this potential is coupled through AND gate 50BF and OR gate 108 to the input electrodes of transistors 30A and 30D which are thus held off. The ground potential of output lead 166 of flip-flop 160 acting through diode 130C holds off transistor 30C. In this way, each counting pulse applied to the flip-flop causes the count to proceed in a forward direction along the series of transistors from transistor 30A to 30B, etc.

Assuming that the count is at transistor 30C and it is desired to reverse the direction of the counting cycle, then the reverse count control lead 70 is energized and the series of AND gates 50AR to 50DR is rendered operative. At this time, the ground potential of the output electrode of transistor 30C is coupled through AND gate 50CR and OR gate 108 and through diodes 130A and 130D to hold off transistors 30A and 30D. The ouput lead 168 of flip-flop 160 operating through diode 130B holds off transistor 30B. It can be seen then that the next counting pulse applied to flip-flop 160 reverses the potentials on its output leads and removes the ground potential from the input electrode of transistor 30B which is thus caused to turn on. Transistor 30B, acting through its output lead and AND gate 50BR and OR gate 88, holds off transistors 30C and 30D, and the output lead 166 of flip-flop 160, acting through diode 130A, holds off transistor 30A. The next counting pulse applied to the flip-flop causes transistor 30A to be turned on. In this way, the counting cycle can be executed from one counting device to the next in the reverse direction. If at any time it is again desired to cause the counter to operate in a forward direction, then the reverse count control line and its associated AND gates are rendered inoperative, and the forward count control line and its AND gates are rendered operative.

What is claimed is:

1. A reversible counter including a plurality of counting devices A, B, C, D arrayed in a series having a forward counting direction from A to B to C to D to A to B and a reverse counting direction from D to C to B to A to D to C, etc., each device having an input lead and an output lead, a plurality of two-input, one-output forward AND gates corresponding in number to said counting devices and including A, B, C, D AND gates, one forward AND gate being associated with each counting device, a plurality of two-input, one-output reverse AND gates corresponding in number to said counting devices and including A, B, C, D AND gates, one reverse AND gate being associated with each counting device, the output lead of each counting device being coupled to one input of its associated two-input forward AND gate and to one input of its associated two-input reverse AND gate, a forward count control line coupled to the second input of each forward AND gate, a reverse count control line coupled to the second input of each reverse AND gate, a series of OR gates having two inputs and one output and corresponding in number to said counting devices, each forward AND gate and the reverse AND gate associated with the adjacent leading position having their single outputs coupled to the inputs of one OR gate so that the output of D forward and A reverse AND gates, C forward and D reverse AND gates, B foward and C reverse AND gates, and A forward and B reverse AND gates are coupled to the inputs of separate OR gates, the single output of each OR gate being coupled through diodes to the input lead of each counting device except the counting devices which are coupled to its associated AND gates, said diodes being oriented so that when one counting device registers a count, the potential on its output lead is used as a cut-off potential which is coupled to and renders inoperative all other devices except the device adjacent to and leading it in the selected counting direction, and auxiliary circuit means coupled to said devices and applying cut-off potential to the counting device which is adjacent to and leading a device which is registering a count.

2. The counter defined in claim 1 wherein said auxiliary circuit means comprises a flip-flop having two outputs, each of which is coupled to the input leads of alternate counting devices with one output coupled to the input leads to counting devices A and C, and the other output coupled to the input leads of counting devices B and D, said flip-flop applying both input counting pulses and said cut-off potential to said counting devices.

References Cited by the Examiner

UNITED STATES PATENTS 3,210,567 10/1965 Wolfe _____________ 307—88.5

ARTHUR GAUSS, *Primary Examiner.*

S. D. MILLER, *Assistant Examiner.*